United States Patent [19]

Aoyama et al.

[11] Patent Number: 4,615,853
[45] Date of Patent: Oct. 7, 1986

[54] METHOD FOR PRODUCING THERMOPLASTIC RESIN SHEET OR FILLER-CONTAINING RESIN SHEET

[75] Inventors: Takeo Aoyama, Yokohama; Tadashi Kamei, Yokosuka; Mikio Uehara, Tokyo, all of Japan

[73] Assignee: Nippon Petrochemicals Company, Limited, Tokyo, Japan

[21] Appl. No.: 658,283

[22] Filed: Oct. 5, 1984

[30] Foreign Application Priority Data

Oct. 5, 1983 [JP] Japan .............................. 58-186097
Nov. 8, 1983 [JP] Japan .............................. 58-209472

[51] Int. Cl.[4] ...................... B29C 43/24; B29C 43/48; B29C 67/16
[52] U.S. Cl. .................................. 264/122; 264/104; 264/105; 264/110; 264/127; 264/175; 264/280; 264/316; 425/371
[58] Field of Search ............... 264/119, 122, 126, 127, 264/165, 175, 316, 104, 105, 110, 280; 425/371

[56] References Cited

U.S. PATENT DOCUMENTS

| | | | |
|---|---|---|---|
| 2,537,311 | 1/1951 | Lyon .................... | 264/175 |
| 2,574,588 | 11/1951 | Piperoux et al. ............ | 264/280 X |
| 2,960,727 | 11/1960 | Bradshaw et al. ............ | 264/126 |
| 3,223,027 | 12/1965 | Shigemarisoda et al. ...... | 425/371 X |
| 3,400,186 | 9/1968 | Wiley ..................... | 264/165 X |
| 3,801,250 | 4/1974 | Kaiser et al. .............. | 425/371 X |

FOREIGN PATENT DOCUMENTS 1098946  1/1968  United Kingdom ................ 264/175

Primary Examiner—Jan Silbaugh
Attorney, Agent, or Firm—Scully, Scott, Murphy & Presser

[57] ABSTRACT

A method for producing a thermoplastic resin sheet or a filler-containing thermoplastic resin sheet by which method a difficultly-workable thermoplastic resin as well as an ordinary thermoplastic resin can be formed into a sheet and various kinds of fillers can be compounded into the sheet. The method is characterized in that a thermoplastic resin or a composition of a thermoplastic resin and a filler is fed in powder or preformed sheet form between a pair of tensioned endless belts disposed parallel and travelling together around a set of rolls, the endless belts being heated by being brought into surface-to-surface contact with heating rolls while travelling along a path having at least one bend formed by the heating rolls, and the material is heated and compressed between the endless belts and melted into an integral body at or above the melting point or softening point of the thermoplastic resin.

4 Claims, 3 Drawing Figures

METHOD FOR PRODUCING THERMOPLASTIC RESIN SHEET OR FILLER-CONTAINING RESIN SHEET

BACKGROUND OF THE INVENTION (1) Field of the Invention

This invention relates to a method for producing a thermoplastic resin sheet or a filler-containing resin sheet.

More particularly, the invention relates to a method for producing a thermoplastic resin sheet or a filler-containing resin sheet which is especially suitable for producing a sheet made of thermoplastic resins such as ultra-high molecular weight polyethylene and polytetrafluoroethylene that are difficult to process due to their high melt viscosities and the narrowness between their melting points or softening points and thermal decomposition temperatures, and a resin sheet that contains a large quantity of a filler, or a special class of fillers that will be described later.

(2) Description of the Prior Art

In the conventional art, ordinary plastic films and sheets of polyethylene or polypropylene are produced by tubular film extrusion method of T-die method. These methods are widely employed in the industry because the methods have advantages that they can be put into practice with simple equipment and uniform products can be obtained at high productivity.

The above forming methods, however, cannot be employed for the processing of difficultly-processable resins such as ultra-high molecular weight polyethylene and polytetrafluoroethylene as described below.

Meanwhile, in order to impart desirable properties to thermoplastic resins, fillers are often compounded into resin materials. In the above processing methods, however, when a filler is compounded in large quantities, the forming operation becomes difficult because their flow properties such as melt flow become worse.

Furthermore, when fibrous fillers such as glass fiber and carbon fiber, hollow particle fillers such as glass balloons, and flaky fillers such as mica are used, the abrasion of the apparatus is accelerated and quite a large cost for the maintenance of extruder is necessary. In addition, the obtained products cannot have the desired properties because particles of the filler are broken down by the shearing force caused in the extrusion.

Ultra-high molecular weight polyethylene has excellent impact strength and abrasion resistance. However, the consumption of this resin is very small because the processing of a resin of this kind is difficult. The methods for forming articles of ultra-high molecular weight polyethylene are exemplified by sintering, ram extrusion using a plunger pump, and forging. For forming plates and boards from this resin, compression molding is mainly employed. However, it is very difficult to produce thin sheets or films of less than 1 mm in thickness from ultra-high molecular weight polyethylene. (The term "sheet or film" will be hereinafter referred to as simply "sheet" and it should be noted that the term "sheet" or "sheets" used also in connection with the method of this invention includes "film(s) and sheet(s)". According to the present industrial practice, thin sheets of this kind are produced by applying a secondary working such as skiving to a cylindrical body of material that is obtained by the abovementioned method. Therefore, in the above method, the processing cost is high as well as the continuous mass production of thin sheets is quite difficult.

This fact depends upon the reason that ultra-high molecular weight polyethylene has quite a high melt viscosity and is not good in melt flow, and therefore, the conventionally employed tubular film method and T-die method in which the pressure drop is large, are not suitable.

In the case of polytetrafluoroethylene, since the difference between its forming temperature and thermal decomposition temperature is small, the above ordinary forming methods cannot be employed, either.

Meanwhile, as a hitherto well known method for forming sheets, there is a calender roll method. Because sheets of accurate and uniform thickness can be produced at a high rate, polyvinyl chloride sheets and rubber sheets are produced by this method. In the case of polyolefin resins, their melt strengths are low and their melt viscosities are largely dependent on temperatures, so that the optimum range of their forming temperatures is narrow, which makes the forming operation difficult. Accordingly, this method is seldom employed practically.

SUMMARY OF THE INVENTION

In view of the above-described state of the prior art, the inventors of the present application have carried out extensive studies to solve these problems, and as a result, the present invention has been accomplished.

It is, therefore, the primary object of the present invention to eliminate the above-described disadvantages in the conventional art by proposing a novel method for producing a thermoplastic resin sheet from a difficultly-processable resin such as ultra-high molecular weight polyethylene or fluorocarbon resins.

The second object of the present invention is to provide a method for producing a thermoplastic resin sheet in which a large quantity of a filler is compounded.

The third object of the present invention is to provide a method for producing a resin sheet in which a filler such as fibrous, flake or hollow particle filler that is easily broken by shearing force in usual extrusion, can be well compounded.

The fourth object of the present invention is to provide a method for producing a filler-containing resin sheet using the difficultly-workable thermoplastic resin material.

Pursuant to the above objects, the method of the present invention is characterized in that a thermoplastic resin or a composition of a thermoplastic resin and a filler is fed in powder or preformed sheet form between a pair of tensioned endless belts disposed parallel and travelling together around a set of rolls, the endless belts being heated by being brought into surface-to-surface contact with heating rolls while travelling along a path having at least one bend formed by the heating rolls, and the material is heated and compressed between the endless belts and melted into an integral body at or above the melting point or softening point of the thermoplastic resin.

DETAILED DESCRIPTION OF THE INVENTION

Figure 1:
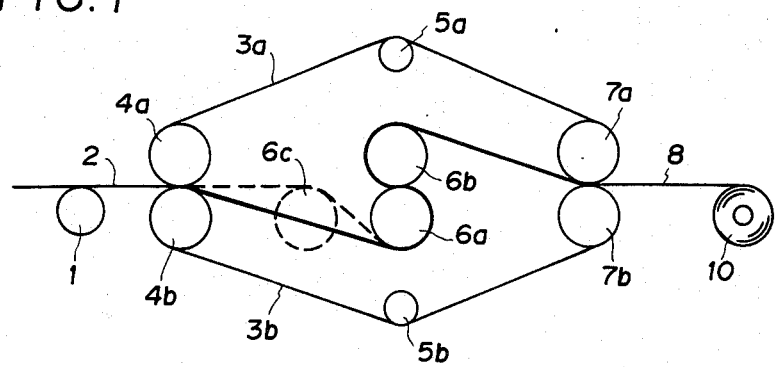
FIG. 1 is a schematic side view of a first embodiment of apparatus to carry out the method of the present invention that is provided with two or three heating rolls.

The thermoplastic resins that are used in the method of the present invention include those which can be formed into sheets by conventional extrusion, which are exemplified by polyolefin resins including homopolymers such as low, medium or high density polyethylene, polypropylene, polybutene-1 and poly-4-methylpentene-1, and copolymers of ethylene or propylene with other α-olefins; polyamide resins such as Nylon-6 (trademark of E. I. du Pont), Nylon-6,6, Nylon-11 and Nylon-12; saponified product of ethylenevinyl acetate copolymer, polyvinyl chloride resin, polyvinylidene chloride resin, polystyrene resin, polyester resin, polyacetal resin, and mixtures of them. The thermoplastic resins with which the present invention produces marked effects are difficultly-workable thermoplastic resins that cannot be easily formed into a sheet by ordinary methods.

Typical difficultly-workable thermoplastic resins are ultra-high molecular weight polyethylene with an intrinsic viscosity of 8 or higher in a decalin solution at 135° C., fluorocarbon resins such as polytetrafluoroethylene; polycarbonate resin, polyimide resin, polyamide-imide resin, polyether ether ketone resin, polyether sulfone resin, polysulfone resin, polyphenylene oxide resin, polyphenylene ether resin, polyphenylene sulfide resin and aromatic polyamide resin.

In the method for producing a thermoplastic resin sheet to meet the first object of the present invention, a powder or a preformed porous sheet of one or more of the foregoing thermoplastic resins is introduced between a pair of endless belts, preferably made of metal, which are stretched under a tension of preferably 3 kg/cm or higher. The material is then compressed between the endless belts and fused into an integral body by bringing the endless belts into surface contact with a plurality of heating rolls that are heated to predetermined temperatures. If necessary, the formed sheet is then cooled by passing it along cooling rolls that are installed on the rear part of said heating rolls, thereby producing a sheet product.

In the method for producing a filler-containing resin sheet to meet the second, third and fourth objects of the invention, a composition of one or more of the foregoing thermoplastic resins and a filler, in mixed powder or preformed porous sheet form, are introduced between a pair of endless belts, preferably made of metal, which are stretched under a tension of preferably not lower than 3 kg/cm. The material is then compressed between the endless belts and fused into an integral body by bringing the endless belts into surface contact with a plurality of heating rolls that are heated to predetermined temperatures. If necessary, the formed sheet is then cooled by passing it along cooling rolls that are installed on the rear part of the heating rolls, thereby producing a filler-containing sheet.

The heating temperature in the above process is not lower than the melting point (or softening point) of the thermoplastic resin but lower than the decomposition point of the thermoplastic resin. It is preferable that the heating temperature is about 10° to 300° C. higher than the melting point (or softening point) of the thermoplastic resin.

The fillers used in the method of the present invention are either organic or inorganic ones, in the forms of powder, granules, flakes, scales, needles, spheres, hollow particles, fiber and woven fiber.

The organic and inorganic fillers are exemplified by powdery or granular fillers such as calcium carbonate, magnesium carbonate, calcium sulfate, calcium silicate, clay, diatomaceous earth, talc, alumina, siliceous sand, glass powder, iron oxide, metal powder, antimony trioxide, graphite, silicon carbide, silicon nitride, silica, boron nitride, aluminum nitride, wood flour and carbon black, mica, glass flake, sericite, pyrophyllite, metal flake such as aluminum flake, flake or scaly filler such as graphite, hollow particulate fillers such as perlite and Shirasu balloons (made in Japan), metal balloons, glass balloons, and pumice powder, mineral fibers such as glass fiber, carbon fiber, graphite fiber, whisker, metal fiber, silicon carbide fiber, asbestos, and wollastonite; organic fibers such as viscose fiber, polyamide fiber, and polyvinyl alcohol fiber, and fillers in continuous sheet form such as woven or non-woven glass fiber mat and organic fiber mat.

The compounding ratio of the above exemplified fillers is preferably in the range of 5 to 1000 parts by weight to 100 parts by weight of the thermoplastic resin. If the quantity of a filler is less than 5 parts by weight, the effect of the addition of filler is usually not produced. However, when a filler is added as an antistatic agent, lower loadings of the filler are acceptable. On the other hand, if the quantity of a filler exceeds 1000 parts by weight, it is likely that the obtained filler-containing sheet does not meet the property requirements.

One of the characteristic features of the present invention is that a pair of tensioned endless belts are moved in surface contact with the surfaces of a plurality of heating rolls and the thermoplastic resin that is put between the endless belts is formed into a sheet. This procedure can produce quite a large effect in the forming of sheets of a difficultly-workable thermoplastic resin, sheets containing a large quantity of a filler, sheets containing a special filler, and sheets of a difficultly-workable thermoplastic resin containing a filler, which can not be produced satisfactorily in the prior art processes.

For example, if a powder of ultra-high molecular weight polyethylene is fed between a pair of horizontally moving parallel endless metal belts and the belts are passed, and pressed together, between a pair or more of uprightly stacked heating rolls, no satisfactory sheet can be obtained, with many transverse cracks occurring in the sheet, because the melt flowability of the ultra-high molecular weight polyethylene is very low and only a linear compression force is exerted on the belts crosswise. In the method of the present invention, however, belts are moved under tension in a meandering or zigzag mode along the surfaces of a plurality of heating rolls, making surface-to-surface contact with them. Thus the ultra-high molecular weight polyethylene, or a composition of a thermoplastic resin and a filler, or a preformed sheet of them that is carried between the pair of endless belts is subjected to heat and pressure and fused into an integral body. Therefore, according to the method of the present invention, it is possible to produce continuously sheets and filler-containing sheets which are tough, abrasion resistant and free from transverse cracks.

In the method of the present invention, the number of heating rolls is preferably 2 to 10 but it is not necessary that the temperatures of the rolls are made all the same. As the material is pressed between the tensioned endless belts, it is preferable that the temperatures of the rolls in the initial and final stages is made rather low in order to facilitate the removing of air from among the particles of the thermoplastic resin in the initial stage and the release of the obtained sheet from the belt in the final stage.

The physical properties of the sheet obtained by the method of the invention largely depend upon the tension of the belts, that is, the pressure applied to the resin held between the pair of belts, the travelling speed of the belts, the time length of contact between the belts and heating roll surfaces, and the surface temperatures of the heating rolls. These conditions can be properly determined in accordance with the kinds of thermoplastic resin and filler used.

Especially, the tension of the belts and the time length of contact between the belts and heating rolls are closely related to each other. When the tension of the belts is low, a long contact time is necessary, while if the belts are stretched under a high tension, a short contact time is sufficient to produce a desirable tough sheet without air bubbles contained.

The tension of the belts depends upon the kind of resin and other forming conditions. For example, when a difficultly-workable resin is used, the tension is preferably 3 kg/cm or higher, and more preferably higher than 10 kg/cm as determined by a strain gauge. If the tension of the belts is lower than 3 kg/cm, the rate of sheet formation becomes very low as well as it is likely that the physical properties of the obtained sheet are not good enough.

The higher the belt tension is the better because the rate of formation can be made higher and a tough sheet can be obtained. However, when the tension of belts is too high, the belts can break or their life becomes shorter. Accordingly, the maximum tension of the belts must be properly determined in accordance with the strength of the belts, the forming conditions and other factors.

The belts used in the method of the present invention are preferably made of a metal such as stainless steel. If desired, however, the metal belts may be employed with a coating of a resin such as fluorocarbon resin or silicone resin.

In the method of the present invention, the thermoplastic resin with or without a filler is fed in the form of powder or preformed sheet. For example, when a powder is fed, it is put on a lower belt and then leveled by a doctor knife or the like. The powder is then passed into the space between the lower belt and the upper belt and, while the belts are passed along heating rolls, is compressed between the belts. When a preformed sheet is fed, it is prepared in advance on calendar rolls from a thermoplastic resin or a composition of a thermoplastic resin and a filler (Japanese Patent Application No. 58-154,523, published Mar. 13, 1985, invented by the same inventors); a filler may be sandwiched between a pair of preformed thermoplastic resin sheets, to obtain a preformed sheet. Use of preformed sheets is preferable because it will help to produce a sheet of uniform thickness through uniform and stable feeding.

The method of the present invention will be described in more detail with reference to the embodiments shown in the attached drawings.

Figure 2:
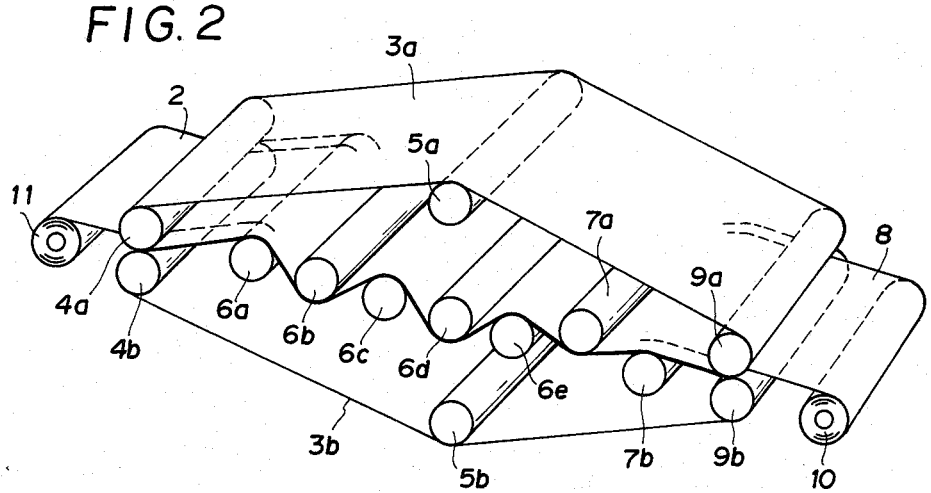
FIG. 2 is a schematic perspective view of a second embodiment of apparatus for the method of the invention that is provided with five heating rolls.
Figure 3:
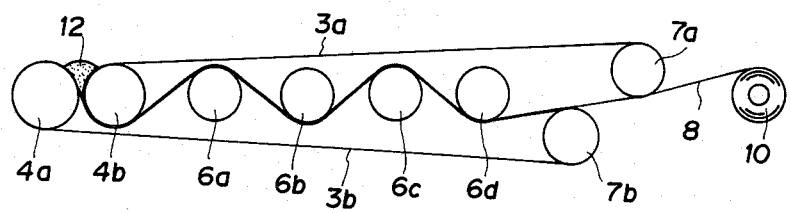
FIG. 3 is a schematic side view of a third embodiment of apparatus for the method of the invention with which apparatus a powder of a thermoplastic resin is formed into a sheet.

FIGS. 1 to 3 show the embodiments of apparatus used in the method of the present invention. The apparatus schematically illustrated in FIG. 1 is provided with two or three heating rolls.

In FIG. 1, the numeral 2 denotes a preformed sheet which is previously made by feeding a thermoplastic resin to a set of calender rolls. From the last roll 1 of the calender rolls, this preformed sheet 2 is introduced into the space between a pair of endless steel belts 3a and 3b. The endless steel belts 3a and 3b are employed under tension by being stretched in different directions by feed rolls 4a and 4b and guide rolls 5a and 5b. The endless steel belts 3a and 3b are passed along a path having having at least a bend formed by a group of heating rolls 6a and 6b (if heating rolls are three, also with a roll 6c shown by broken lines) and between cooling rolls 7a and 7b. The belts 3a and 3b travel round the set of rolls and, being pressed against the heating rolls 6a, 6b (and 6c), under the tension, come into tight surface-to-surface contact with them to form a product sheet 8, which sheet is then wound up on a wind-up roll 10.

The arrangement of the above-described heating rolls 6a, 6b and 6c is not restricted to that shown in FIG. 1. However, the heating rolls must be so arranged that they are in surface-to-surface contact with the pair of endless steel belts and the rolls press the belts effectively.

FIG. 2 is a schematic perspective view of another embodiment of apparatus which is provided with five heating rolls. A roll 11 carries a preformed sheet 2 and the sheet 2 is fed between a pair of endless steel belts 3a and 3b which pass between feed rolls 4a and 4b, respectively. In the like manner as the apparatus shown in FIG. 1, the endless steel belts 3a and 3b are stretched in opposite directions by guide rolls 5a and 5b and tension rolls 9a and 9b. Thus the tension is applied to the endless steel belts 3a and 3b.

The endless steel belts 3a and 3b are travelling along and in surface contact with a group of heating rolls 6a, 6b, 6c, 6d and 6e and cooling rolls 7a and 7b, during which the product sheet 8 is formed and it is wound up on a wind-up roll 10.

The apparatus shown in FIG. 3 is provided with four heating rolls and a product sheet is formed directly from a powder of thermoplastic resin.

In this apparatus, feed rolls 4a and 4b are arranged in parallel on a horizontal plane. The powder of thermoplastic resin 12 is fed in the space between a pair of tensioned endless steel belts 3a and 3b on the circumferential surfaces of feed rolls 4a and 4b. The endless steel belts 3a and 3b, which compress the resin powder, are moved at a predetermined speed along heating rolls 6a, 6b, 6c and 6d in a zigzag way having surface contact with them. Thus the upper and lower surfaces of the pair of steel belts 3a and 3b are heated one after the other, and the steel belts 3a and 3b are then cooled by being passed along cooling rolls 7a and 7b. The sheet 8 thus formed is then wound up on a wind-up roll 10 as a product. The thickness of the above formed sheet 8 can be regulated properly by adjusting the gap between the feed rolls 4a and 4b.

As described above, according to the method of the present invention, it is possible to form not only sheets of ordinary thermoplastic resins but also sheets of the difficultly-workable thermoplastic resins which have been regarded as difficult to form in the conventional art. Furthermore, if the kinds of resins and fillers are properly selected, various marked advantages can be obtained by imparting to the filler-containing sheets several desirable characteristics such as functional properties, mechanical strength, electrical properties and so forth.

The film or sheet made of ultra-high molecular weight polyethylene or fluorocarbon resin produced in accordance with the method of the present invention can be used as a material for making hoppers and skis by laminating it with a base material of metal or plastics. The film made of polyimide resin or polyether ketone resin may be used as an electrical insulator for cables and flexible printed circuits in electric and electronic fields.

Furthermore, when a sheet is produced using a composition of an ultra-high molecular weight polyethylene and a filler of metal fiber or carbon fiber (for which extrusion is not suitable) or carbon black of a large aspect ratio such as Ketjenblack (trademark), an unexpectedly tough antistatic or electroconductive sheet can be obtained.

Still further, a tough electromagnetic shielding sheet can be produced from a combination of ultra-high molecular weight polyethylene and a metal powder such as iron oxide, and a lubricant sheet is obtained from a combination of the above resin and graphite.

In the following, the relationship between kinds of fillers and functions that are provided by them is shown. However, the present invention is not restricted to this exemplar description.

Improvement of physical properties:
Steel powder, aluminum oxide, calcium carbonate, talc, mica, clay, glass fiber, carbon fiber, glass balloon, wollastonite, calcium sulfate, calcium sulfite, silica, silicone carbide, etc.

Thermal and electric conductivity:
Metal powders such as copper powder, iron powder, silver powder, steel powder, and aluminum powder; carbon black, metal fiber, carbon fiber, etc.

Electromagnetic shielding property:
Metal powder such as iron oxide powder, copper powder, and iron powder; metal fiber, aluminum flake, etc.

Abrasion resistance:
Graphite, molybdenum disulfide, etc.

Flame retarding property:
Antimony oxide, etc.

Weather resistance:
Carbon black, etc.

Besides the above fillers, other various fillers can be used, for example, iron powder and nickel alloy powder are used for imparting magnetizable property; glass beads, for light scattering property; and Shirasu balloons or the like, for lightness in weight.

Within the gist of the present invention, suitable quantities of other materials and additives can be used together. Included in the list here, for example, are: synthetic rubbers such as ethylene-propylene rubber (EPR), ethylene-propylene-diene methylene linkage (EPDM), and styrene-butadiene rubber (SBR); natural rubber, petroleum resins, polyolefins modified by unsaturated carboxylic acids, pigments, UV absorbers, antioxidants, plasticizers, and coupling agents such as silanes and titanates.

As described above, it is of course possible to produce a sheet from a common thermoplastic resin and a filler. As compared with the conventional sheet forming methods, the method of the present invention have several advantages as follows:

(a) The sheet forming of the difficultly-workable thermoplastic resins is possible.

(b) Larger quantity of fillers can be compounded than in prior art methods.

(c) Special fillers which are hard to use in the prior art methods without loss of some of their properties can be compounded retaining their functions almost intact.

(d) Filler-containing sheets of difficultly-workable thermoplastic resins can be produced. In addition, a wide range of filler loadings is made possible and the compounding of special fillers in the sheet is likewise possible.

Furthermore, as described above, the filler-containing sheets produced according to the method of the invention, owing to their special properties and functions, as electrical insulating and electromagnetic shielding materials, can be used in electric and electronic fields for the production of, for example, flexible printed circuits. Still further, the sheets can be used in many other fields such as civil engineering and construction industry.

The present invention will be described further with reference to several examples.

EXAMPLE 1

In the apparatus shown in FIG. 2, the surface temperature of heating rolls 6a to 6e was set to 170° C. and that of cooling rolls 7a and 7b and tension roll 9a was set to 10° C. A porous sheet of 0.4 mm in thickness was preformed on calender rolls from an ultra-high molecular weight polyethylene (trademark: Hizex Million 240 M, made by Mitsui Petrochemical Industries, Ltd., intrinsic viscosity: 14 in 135° C. decalin soln.). Two layers of this preformed sheet were superposed and fed at a feed rate of 30 cm/min. into the space between endless steel belts 3a and 3b at feed rolls 4a and 4b. The tension applied to the endless steel belts 3a and 3b was 12 kg/cm.

Thus, a 0.7 mm thick ultra-high molecular weight polyethylene sheet was obtained continuously from the space between tension rolls 9a and 9b. This sheet was considerably transparent and had no occluded air bubbles.

The properties of this sheet were as follows:
Yield tensile strength: 200 kg/cm$^2$
Ultimate tensile strength: 370 kg/cm$^2$
Elongation at break: 380%
Tensile impact strength: 2200 kg.cm/cm$^2$
Taber abrasion (CS-10): 0.9 mg/1000 rotations

EXAMPLE 2

Using the same apparatus as in Example 1, the tension of the steel belts was increased to 30 kg/cm and their speed was changed to 70 cm/min. A single sheet of the same 0.4 mm thick porous preformed sheet as used in Example 1 was fed continuously and a sheet of about 0.4 mm thickness having no air bubbles was obtained continuously.

The properties of the obtained sheet were as follows:
Yield tensile strength: 210 kg/cm$^2$
Ultimate tensile strength: 360 kg/cm$^2$
Elongation at break: 350%
Tensile impact strength: 2000 kg.cm/cm$^2$
Taber abrasion (CS-10): 0.8 mg/1000 rotations

EXAMPLE 3

In the apparatus shown in FIG. 3, the surface temperature of feed rolls 4a and 4b were maintained at 330° C. and the surface temperature of heating rolls 6a to 6d was maintained at 375° C. Steel belts 3a and 3b were moved at a speed of 10 cm/min. under a tension of 34 kg/cm. A powder of Teflon (trademark, made by E. I. du Pont) was fed between feed rolls 4a and 4b. By adjusting the gap between feed rolls 4a and 4b, a continuous sheet of 0.3 mm in thickness was obtained. The tensile strength of this sheet was 185 kg/cm$^2$.

EXAMPLE 4

In the apparatus shown in FIG. 3, the tension of steel belts 3a and 3b was set to 14 kg/cm, the surface temperature of feed rolls 4a and 4b was set to 130° C., the surface temperature of heating rolls 6a to 6d was set to 180° C., and the surface temperature of cooling rolls 7a and 7b was set to 15° C. 30% by weight of 6 mm long glass fiber was added to polyethylene (trademark: Hostalen GUR 412, made by Farbwerke Hoechst AG, intrinsic viscosity: 15 in 135° C. decalin soln.) and they were mixed by an Omni mixer (trademark, made by Chiyoda Technical Industrial Co., Ltd.) The obtained mixture was fed between feed rolls 4a and 4b and, by adjusting the space between the feed rolls, a 0.5 mm thick sheet was formed at a rate of 30 cm/min.

The flexural modulus was 53,000 kg/cm$^2$ and the breakage of glass fiber was little observed.

EXAMPLE 5

To the same resin as that in Example 1 was added 25% by weight of Ketjenblack EC (carbon black) and they were mixed together by a Henschel mixer. In the like manner as Example 1, sheet forming was carried out to obtain a 0.2 mm thick film.

The surface resistivity of the obtained film was 10$^4$ Ω.

EXAMPLE 6

An ultra-high molecular weight polyethylene (trademark: Hizex Million 240 M, made by Mitsui Petrochemical Industries, Ltd., intrinsic viscosity: 14 in 135° C. decalin soln.) was mixed with 30% by weight of aluminum fiber (3 mm × 60μφ) in an Omni mixer. After that, a 0.5 mm thick sheet was obtained in the like manner as Example 1.

The volume resistivity of the obtained sheet was 0.06 Ω.cm and the aluminum fiber was little broken.

EXAMPLE 7

An ultra-high molecular weight polyethylene (trademark: Hifax 1900, made by Hercules Powder Co., intrinsic viscosity: 19 in 135° C. decalin soln.) was mixed with 40% by weight of mica in a Henschel mixer. After that, a 0.5 mm thick sheet was obtained in the like manner as Example 1.

The flexural modulus of the obtained sheet was 52,000 kg/cm$^2$.

EXAMPLE 8

A 0.3 mm thick porous sheet was preformed from an ultra-high molecular weight polyethylene (trademark: Hifax 1900) on calender rolls of 157° C. surface temperature.

Glass fiber mat was interposed between a pair of the thus obtained porous sheets and sheet forming was carried out by using the apparatus shown in FIG. 2. In the apparatus, steel belts 3a and 3b, coated with Teflon, were used under a tension of 34 kg/cm. The surface temperature of feed rolls 4a and 4b was set to 30° C., that of heating rolls 6a to 6e was set to 185° C., and that of cooling rolls 7a and 7b was set to 15° C. Thus, a 0.8 mm thick sheet was obtained at a belt speed of 30 cm/min.

The glass fiber content of the obtained sheet was 50% by weight and the flexural modulus of the sheet was 76,000 kg/cm$^2$.

EXAMPLE 9

A powder of nylon-6 (trademark: Ube Nylon 1030 QB, 150 mesh through, made by Ube Industries, Ltd.) was mixed with 40% by weight of aluminum fiber (3 mm × 90μφ) in an Omni mixer. The obtained mixture was formed into a sheet by using the apparatus shown in FIG. 3. In the apparatus, steel belts coated with Telfon were used under a tension of 10 kg/cm. The surface temperature of feed rolls 4a and 4b was set to 240° C., that of heating rolls 6a to 6d was set to 260° C. and that of cooling rolls 7a and 7b was set to 20° C. In the like manner as Example 1, a 0.5 mm thick sheet was obtained.

The volume resistivity of the obtained sheet was 0.09 Ω.cm.

What is claimed is:

1. A method for producing a thermoplastic resin sheet or a filler-containing resin sheet which method is characterized in that a difficultly-workable thermoplastic resin or a composition of a difficulty-workable thermoplastic resin and a filler is fed in powder or preformed sheet form between a pair of endless steel belts stretched under a tension of at least 3 kg/cm, disposed parallel and traveling together around a set of rolls, said endless belts being heated by being brought into surface-to-surface contact with heating rolls while travelling along a path having at least one bend formed on said heating rolls, said resin or composition heated and compressed in said bend between said endless belts and melted into an integral body at or above the melting point or softening point of said thermoplastic resin.

2. The method for producing a thermoplastic resin sheet or a filler-containing resin sheet in claim 1, wherein said difficultly-workable thermoplastic resin is a member selected from the group consisting of polyethylene resin having an intrinsic viscosity of 8 or higher in a decalin solution at 135° C., fluorocarbon resin, polycarbonate resin, polyimide resin, polyamide-imide resin, polyether ether ketone resin, polyether sulfone resin, polysulfone resin, polyphenylene oxide resin, polyphenylene ether resin, polyphenylene sulfide resin, aromatic polyamide resin, polyester resin and mixtures thereof.

3. The method for producing a thermoplastic resin sheet or a filler-containing resin sheet in claim 1, wherein said filler is at least one member selected from the group consisting of fibrous fillers, scaly fillers, flaky fillers, needle fillers and hollow particle fillers.

4. The method for producing a thermoplastic resin sheet or a filler-containing resin sheet in claim 1, 2 or 3, wherein the compounding ratio of said filler is 5 to 1000 parts by weight to 100 parts by weight of said difficultly-workable thermoplastic resin.

* * * * *